（12）United States Patent
Sueyoshi et al.

(10) Patent No.: US 8,596,950 B2
(45) Date of Patent: Dec. 3, 2013

(54) TRANSFER ROBOT (75) Inventors: Satoshi Sueyoshi, Fukuoka (JP);
Kentaro Tanaka, Fukuoka (JP);
Tomohiro Matsuo, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 359 days.

(21) Appl. No.: 13/014,722

(22) Filed: Jan. 27, 2011

(65) Prior Publication Data

US 2011/0123305 A1 May 26, 2011

Related U.S. Application Data

(63) Continuation of application No. 12/720,670, filed on Mar. 10, 2010, now Pat. No. 7,905,699, which is a continuation of application No. PCT/JP2008/065491, filed on Aug. 29, 2008.

(30) Foreign Application Priority Data

Sep. 13, 2007 (JP) .................. 2007-237500
Nov. 19, 2007 (JP) .................. 2007-299120

(51) Int. Cl.
*B25J 18/04* (2006.01)
(52) U.S. Cl.
USPC ............ 414/744.5; 414/744.3; 901/15
(58) Field of Classification Search
USPC .......... 74/490.5, 490.6; 294/213; 414/217, 414/744.3, 744.5, 744.7, 816, 935, 941; 901/15, 16
See application file for complete search history.

(56) References Cited

U.S. PATENT DOCUMENTS

| 5,564,889 | A | * | 10/1996 | Araki .................... 414/806 |
| 5,571,325 | A | * | 11/1996 | Ueyama et al. ............. 118/320 |
| 6,655,901 | B2 | * | 12/2003 | Tsubota et al. ............ 414/744.5 |
| 2002/0057955 | A1 | | 5/2002 | Tsubota et al. |
| 2004/0052626 | A1 | | 3/2004 | Oem et al. |
| 2004/0151574 | A1 | * | 8/2004 | Lu .................... 414/816 |

FOREIGN PATENT DOCUMENTS

| JP | 06-338555 | 12/1994 |
| JP | 07-050334 | 2/1995 |
| JP | 09-162257 | 6/1997 |
| JP | 11-188669 | 7/1999 |
| JP | 11-238779 | 8/1999 |

(Continued)

OTHER PUBLICATIONS

Japanese Office Action for corresponding JP Application No. 2010-038928, Aug. 10, 2011.

(Continued)

*Primary Examiner* — Saul Rodriguez
*Assistant Examiner* — Brendan Tighe
(74) *Attorney, Agent, or Firm* — Ditthavong Mori & Steiner, P.C.

(57) ABSTRACT

A transfer robot includes a hand section, a horizontal arm mechanism, and a lift mechanism. An object is to be placed on the hand section. The horizontal arm mechanism is connected to the hand section and includes at least two rotary joints. The horizontal arm mechanism is configured to extend and contract so as to move the hand section along one direction. The lift mechanism is configured to move the horizontal arm mechanism up and down and includes a plurality of link mechanisms disposed on a base member. The horizontal arm mechanism is disposed between parts of the lift mechanism when the horizontal arm mechanism is moved to a lowest position.

24 Claims, 6 Drawing Sheets

(56) References Cited

FOREIGN PATENT DOCUMENTS

| | | |
|---|---|---|
| JP | 2000-006064 | 1/2000 |
| JP | 2000-243809 | 9/2000 |
| JP | 2001-274218 | 10/2001 |
| JP | 2002-210684 | 7/2002 |
| JP | 2004-106167 | 4/2004 |
| JP | 2005-150575 | 6/2005 |
| JP | 2006-088235 | 4/2006 |
| JP | 2006-176276 | 7/2006 |
| TW | 200631743 | 9/2006 |

OTHER PUBLICATIONS

International Search Report for International Application No. PCT/JP2008/065491, Dec. 2, 2008.

Written Opinion of the International Searching Authority for International Application No. PCT/JP2008/065491, Dec. 2, 2008.

Taiwanese Office Action for corresponding TW Application No. 097134556, Aug. 28, 2013.

* cited by examiner

FIG. 1

TRANSFER ROBOT

CROSS-REFERENCE TO RELATED APPLICATIONS

The present application is a continuation application of the U.S. patent application Ser. No. 12/720,670 filed Mar. 10, 2010, which in turn is a continuation application of PCT/JP2008/065491, filed Aug. 29, 2008, which claims priority to Japanese Patent Application No. 2007-237500, filed Sep. 13, 2007, and Japanese Patent Application No. 2007-299120, filed Nov. 19, 2007. The contents of these applications are incorporated herein by reference in their entirety.

BACKGROUND OF THE INVENTION

1. Field of the Invention

The present invention relates to a transfer robot.

2. Discussion of the Background

Some existing transfer robots, which are described in Japanese Unexamined Patent Application Publication No. 11-238779, 2002-210684, and 2006-176276, move up and down by extending and contracting their legs and transfer a workpiece by using an arm disposed in an upper part of the robot.

SUMMARY OF THE INVENTION

According to one aspect of the present invention, a transfer robot includes a hand section, a horizontal arm mechanism, and a lift mechanism. An object is to be placed on the hand section. The horizontal arm mechanism is connected to the hand section and includes at least two rotary joints. The horizontal arm mechanism is configured to extend and contract so as to move the hand section along one direction. The lift mechanism is configured to move the horizontal arm mechanism up and down and includes a plurality of link mechanisms disposed on a base member. The horizontal arm mechanism is disposed between parts of the lift mechanism when the horizontal arm mechanism is moved to a lowest position.

According to another aspect of the present invention, a transfer robot includes a hand section, a horizontal arm mechanism, and a link mechanism. An object is to be placed on the hand section. The horizontal arm mechanism is connected to the hand section and includes at least two rotary joints. The horizontal arm mechanism is configured to extend and contract so as to move the hand section along one direction. The link mechanism is configured to move the horizontal arm mechanism up and down. The horizontal arm mechanism is configured so that the hand section is disposed between a supporting base and a supporting member when the object has been taken out. The supporting base and the supporting member are provided in the horizontal arm mechanism.

According to further aspect of the present invention, a transfer robot includes a hand section, a horizontal arm mechanism, and a lift mechanism. An object is to be placed on the hand section. The horizontal arm mechanism is connected to the hand section and includes at least two rotary joints. The horizontal arm mechanism is configured to extend and contract so as to move the hand section along one direction. The lift mechanism includes a plurality of link mechanisms configured to move the horizontal arm mechanism up and down and disposed on a base member. The horizontal arm mechanism is configured to move in one of a roll direction or a lateral direction with respect to the one direction in which the hand section is moved by rotatably positioning the at least two rotary joints at a predetermined angle.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Embodiments will now be described with reference to the accompanying drawings, wherein like reference numerals designate corresponding or identical elements throughout the various drawings.

Figure 1:
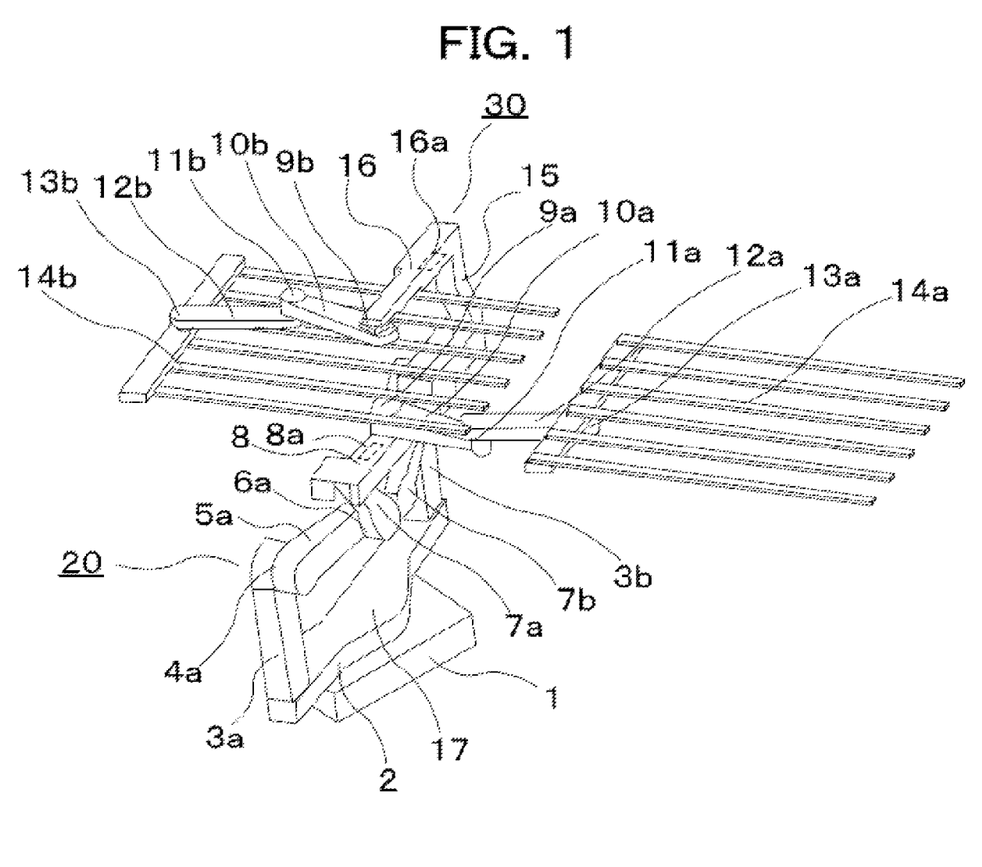
FIG. 1 is a perspective view of a transfer robot.

FIG. 1 is a perspective view of a transfer robot according to an embodiment of the present invention. The transfer robot includes a rotation mechanism 17, a lift mechanism 20, and a horizontal arm mechanism 30 so as to be capable of taking out a workpiece disposed in a cabinet (not shown) and transferring the workpiece to a work area.

The rotation mechanism 17 is disposed in such a manner that the rotation axis of the rotation mechanism 17 is disposed at substantially the center of a base 2 that is attached to a mounting base 1. Leg supporting members 3a and 3b are disposed at ends of the base 2.

The lift mechanism 20 has the following structure. The leg supporting members 3a and 3b include drive units (not shown) that drive first joints 4a and 4b. First ends of first leg sections 5a and 5b are connected to the first joints 4a and 4b. Second ends of the first leg sections 5a and 5b are connected to first ends of second leg sections 7a and 7b via second joints 6a and 6b that include drive units (not shown). Second ends of the second leg sections 7a and 7b are rotatably connected to a supporting base 8. The first leg sections 5a and 5b have a length greater than that of the leg supporting members 3a and 3b so as to be capable of reducing the height of the horizontal arm mechanism 30 when the horizontal arm mechanism 30 is at the lowest position. The second leg sections 7a and 7b have a length smaller than that of the first leg sections 5a and 5b so that lateral sides of the first leg sections 5a and 5b do not protrude from lateral sides of the leg supporting members 3a and 3b when the horizontal arm mechanism 30 is at the lowest position.

In the present embodiment, both the first joints and the second joints include drive units. However, the second joint may be driven by a drive unit for driving the first joint through a belt drive.

Next, the horizontal arm mechanism 30 will be described. The horizontal arm mechanism 30 includes a double-link mechanism that moves two hands 14a and 14b so as to move a workpiece (not shown) in and out of a cabinet. The hands 14a and 14b are moved in vertical directions in which the horizontal arm mechanism 30 is moved up and down by the lift mechanism 20. The hands 14a and 14b are also moved in directions perpendicular to the direction in which second horizontal joints extend when the hands 14a and 14b are retracted toward the lift mechanism 20. The hands 14a and 14b are linearly moved along one direction.

Details of the horizontal arm mechanism 30 will be described. A first end of a first arm section 10a is connected to a first horizontal joint 9a that is disposed on the supporting base 8 and that includes a drive mechanism (not shown). A second end of the first arm section 10a is connected to a first end of a second arm section 12a via a second horizontal joint 11a. A second end of the second arm section 12a is connected to the hand 14a via a third horizontal joint 13a.

A supporting column 15 including a supporting member 16 is attached to the supporting base 8. A first end of a first arm section 10b is connected to the supporting column 15 via a first horizontal joint 9b that is disposed on the supporting base 8 and that includes a drive mechanism (not shown). A second end of the first arm section 10b is connected to a first end of a second arm section 12b via a second horizontal joint 11b. A second end of the second arm section 12b is connected to the hand 14b via a third horizontal joint 13b. The first arm sections 10a and 10b and the second arm sections 12a and 12b face each other and form a facing structure. In the present embodiment, the first horizontal joints 9a and 9b are coaxially disposed so as to face each other in the vertical direction. However, even if the first horizontal joints 9a and 9b are disposed offset from each other with respect to the direction in which the hands 14a and 14b are moved, movement the same as that of the present embodiment can be performed by changing the lengths of the first arm sections 10a and 10b and the second arm sections 12a and 12b. The first horizontal joints 9a and 9b and the third horizontal joints 13a and 13b are disposed on a line with respect to the direction in which the hands 14a and 14b are moved. When the hands 14a and 14b vertically overlap each other, the first horizontal joints 9a and 9b and the third horizontal joints 13a and 13b are disposed vertically coaxial with each other.

In the present embodiment, the rotation axes of the first horizontal joints 9a and 9b are forwardly offset from the rotation axis of the rotation mechanism 17 with respect to the direction in which the hands are moved, so that interference with the rotation mechanism 17 can be avoided. However, even if the rotation axes of the first horizontal joints 9a and 9b are offset in any of forward, backward, left, and right directions with respect to the direction in which the hands 14a and 14b are moved, movement the same as that of the present embodiment can be performed by changing the lengths of the first arm sections 10a and 10b and the second arm sections 12a and 12b.

Figure 2:
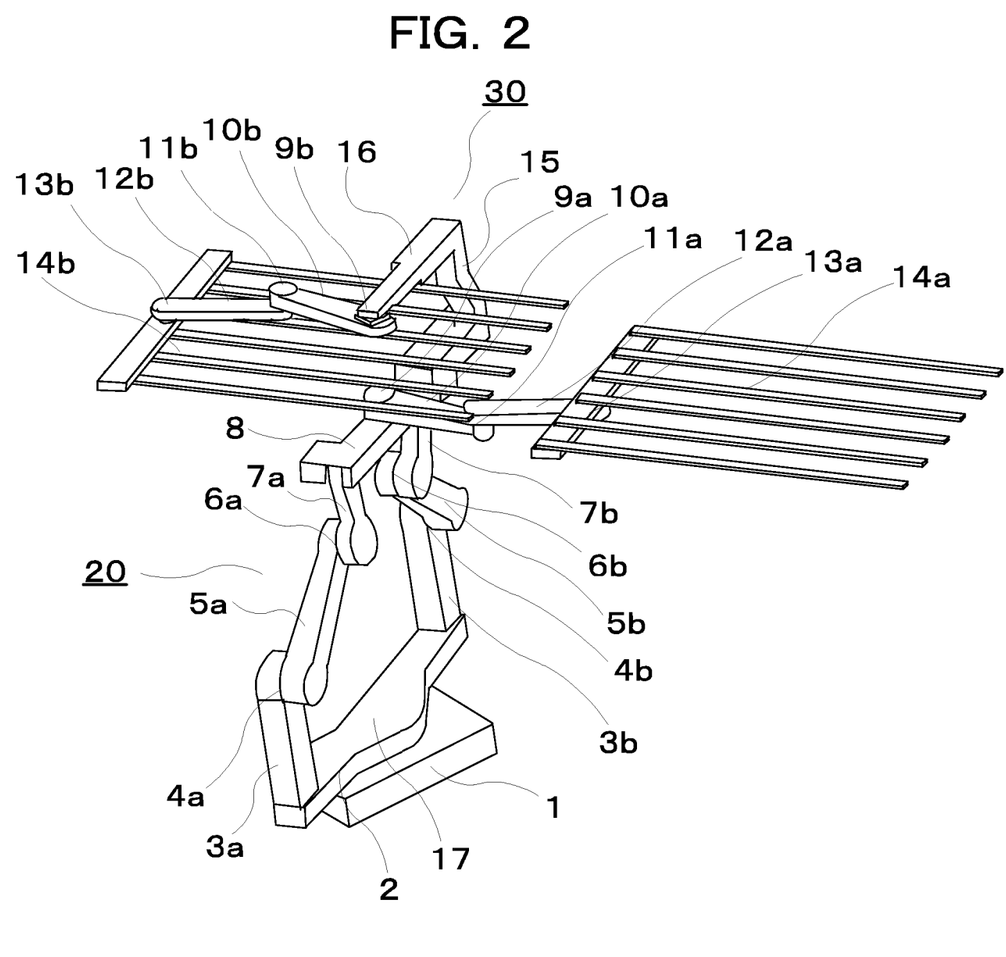
FIG. 2 is a perspective view illustrating a state in which a horizontal arm mechanism is at the highest position.
Figure 3:
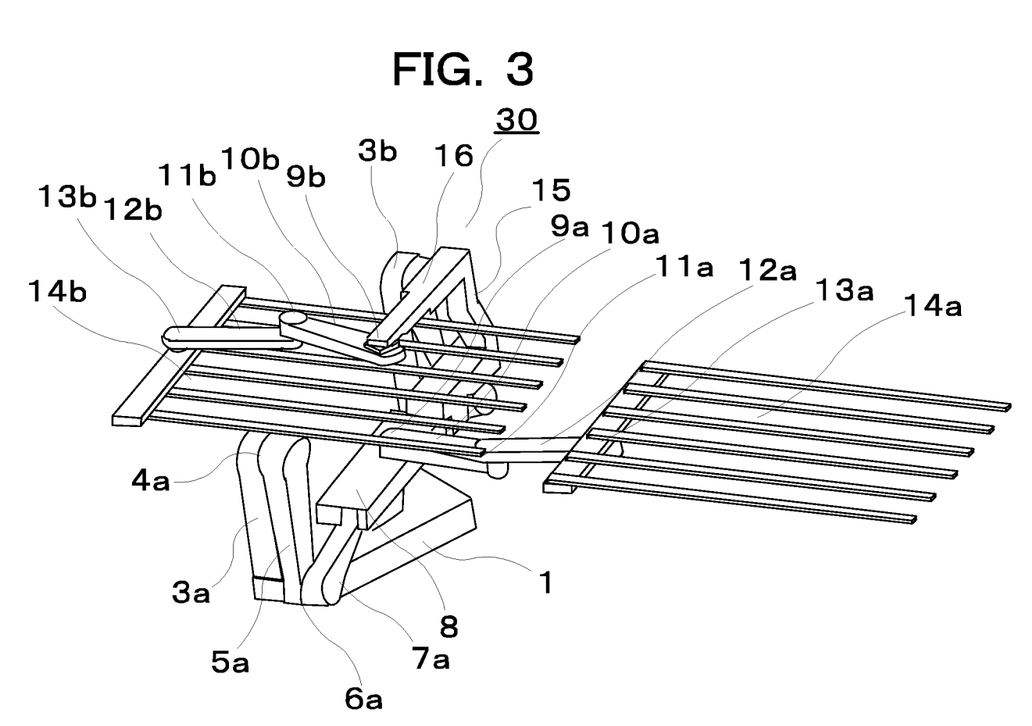
FIG. 3 is a perspective view illustrating a state in which the horizontal arm mechanism is at the lowest position.

Next, movement will be described. First, referring to FIGS. 2 and 3, movement of the lift mechanism will be described. FIG. 2 illustrates a state in which the lift mechanism 20 is at the highest position. FIG. 3 illustrates a state in which the lift mechanism 20 is at the lowest position. One part of the lift mechanism will be described, and description of the other part will be omitted because the other part is plane-symmetric therewith.

Referring to FIGS. 1 and 2, a case in which the lift mechanism is moved to the highest position will be described. Drive mechanisms (not shown), which include motors and the like, of the first joint 4a and the second joint 6a are driven. The first leg section 5a rotates counterclockwise around the first joint 4a, viewed from the direction in which the hand 14a is moved. The second leg section 7a rotates clockwise around the second joint 6a. Thus, the horizontal arm mechanism 30 is moved to the highest position.

Referring to FIGS. 1 and 3, a case in which the lift mechanism is moved to the lowest position will be described. Drive mechanisms (not shown), which include motors and the like, of the first joint 4a and the second joint 6a are driven. The first leg section 5a rotates clockwise around the first joint 4a, viewed from the direction in which the hand 14a is moved. The second leg section 7a rotates counterclockwise around the second joint 6a. Thus, the horizontal arm mechanism 30 is lowered. When the first leg section 5a is at a height the same as that of a surface of the base 2, the first leg section 5a further rotates clockwise around the first joint 4a to such an extent that a lateral side of the first leg section 5a does not considerably protrude from a lateral side of the leg supporting member 3a. The second leg section 7a rotates clockwise around the second joint 6a to the highest position.

When the horizontal arm mechanism 30 has been moved to the lowest position, the horizontal arm mechanism 30 is disposed between parts of the lift mechanism 20. Thus, a workpiece disposed at the lowest position of the cabinet (not shown) can be taken out with the hand 14a attached to the supporting base 8.

Even if one part of the lift mechanism 20 breaks down, the other part of the lift mechanism 20 can drive the horizontal arm mechanism. Therefore, the horizontal arm mechanism can be safely moved to the lowest position without being dropped, so that a workpiece is prevented from being damaged.

The diameter of the rotation area is equal to the distance from the axis of the rotation mechanism 17 to lateral sides of the leg supporting members 3a and 3b. Thus, a comparatively small installation space can be realized.

Next, referring to FIG. 4, correction movement performed by the lift mechanism when the cabinet is disposed at an angle in a roll direction with respect to the direction in which the hand is moved will be described.

Directions of inclination will be described below. The roll direction is the direction of rotation around an axis extending in the direction in which the hand is moved. A yaw direction (described below) is the direction of rotation around an axis along which the lift mechanism vertically moves up and down.

Figure 4:
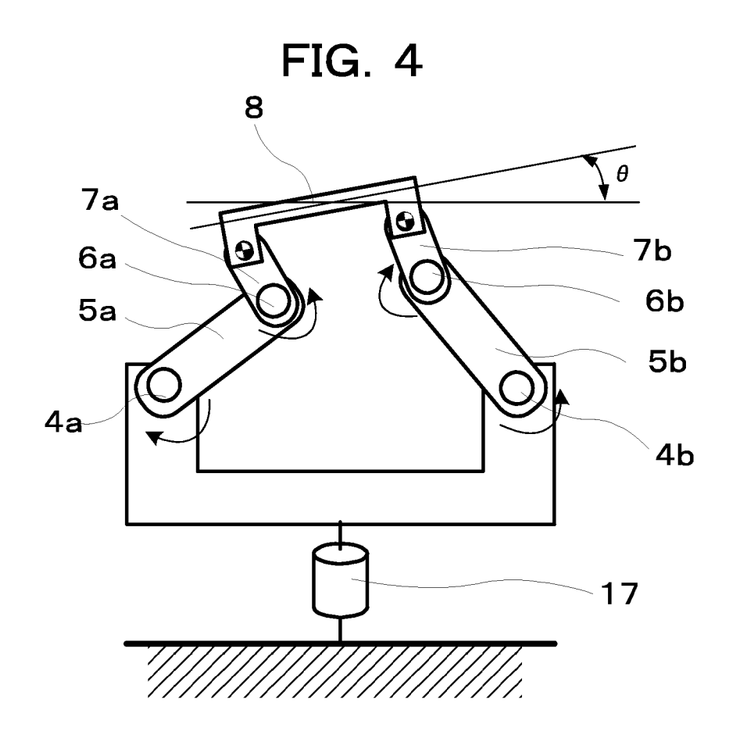
FIG. 4 is a schematic view illustrating movement of a lift mechanism for correcting displacement in the roll direction according to the present invention.

FIG. 4 is a schematic view of the lift mechanism viewed from the direction in which a workpiece is transferred to the cabinet.

When the cabinet is disposed at an angle θ, the first joint 4a is rotated clockwise so as to rotate the first leg section 5a by the angle θ from a horizontal state, and the second joint 6a is rotated counterclockwise so as to rotate the second leg section 7a by the angle θ from a horizontal state. The first joint 4b is rotated counterclockwise so as to rotate the first leg section 5b by the angle θ from a horizontal state, and the second joint 6b is rotated clockwise so as to rotate the second leg section 7b by the angle θ from a horizontal state. Thus, the supporting base 8 is held in a state inclined at the angle θ relative to a horizontal state. A horizontal arm mechanism (not shown) disposed on the supporting base 8 is held in a state inclined at the angle θ relative to a horizontal state.

In order to correct such an inclination, for example, an operator manually corrects the inclination using a pendant when the operator teaches the transfer robot the movement for taking out a workpiece from the cabinet and transferring the workpiece. Once the movement has been taught, the transfer robot moves on substantially the same trajectory when transferring a workpiece.

Next, correction movement that is performed when the cabinet is disposed at an angle in the yaw direction with respect to the direction in which the hand is moved will be described. In order to correct such an inclination, for example, an operator manually corrects the inclination using a pendant when the user teaches the transfer robot movement for taking out a workpiece from the cabinet and transferring the workpiece. At this time, correction movement is made around an axis to a predetermined angle by the rotation mechanism 17 illustrated in FIG. 4. Once the movement has been taught, the transfer robot moves on substantially the same trajectory when transferring a workpiece.

Figure 5:
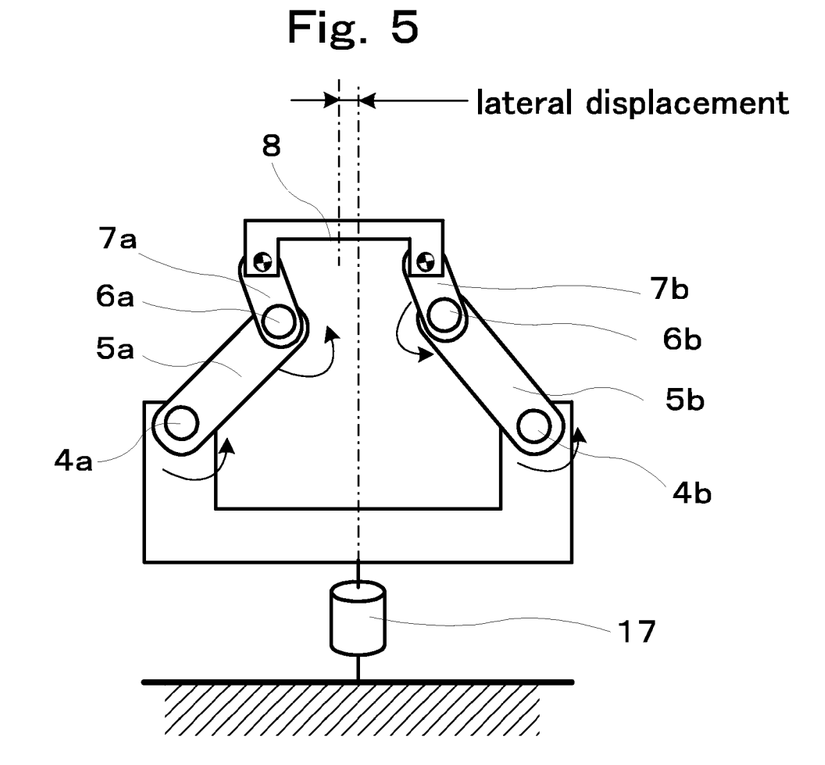
FIG. 5 is a schematic view illustrating movement of a lift mechanism for correcting displacement in the lateral direction according to the present invention.

Next, referring to FIG. 5, correction movement performed when the cabinet is disposed in a laterally displaced position with respect to the direction in which the hand is moved will be described. FIG. 5 is a schematic view of the lift mechanism viewed from the direction in which a workpiece is transferred to the cabinet.

When the cabinet is disposed with a lateral displacement, the first leg section 5a rotates the first joint 4a counterclockwise by an angle θ from a horizontal state, and the second leg section 7a rotates the second joint 6a clockwise by the angle θ from a horizontal state. The first leg section 5b rotates the first joint 4b clockwise by the angle θ from a horizontal state, and the second leg section 7b rotates the second joint 6b clockwise by the angle θ from a horizontal state. Thus, the supporting base 8 can be moved laterally while maintaining a horizontal state, and a horizontal arm mechanism (not shown) disposed on the supporting base 8 can be moved laterally while maintaining a horizontal state.

The cases in which the cabinet is disposed at an angle or disposed with a lateral displacement have been described. However, it is possible that a workpiece is disposed at an angle or with a lateral displacement in the cabinet. Regarding the inclination of the workpiece, it is necessary to consider an inclination in the yaw direction, and it is not necessary to consider an inclination in the roll direction with respect to the direction in which the workpiece is transferred. This is because an inclination of the workpiece in the roll direction, which may be caused by an inclination of a surface of the cabinet on which the workpiece is disposed, does not usually occur because the interior of the cabinet is manufactured with high precision.

Figure 6:
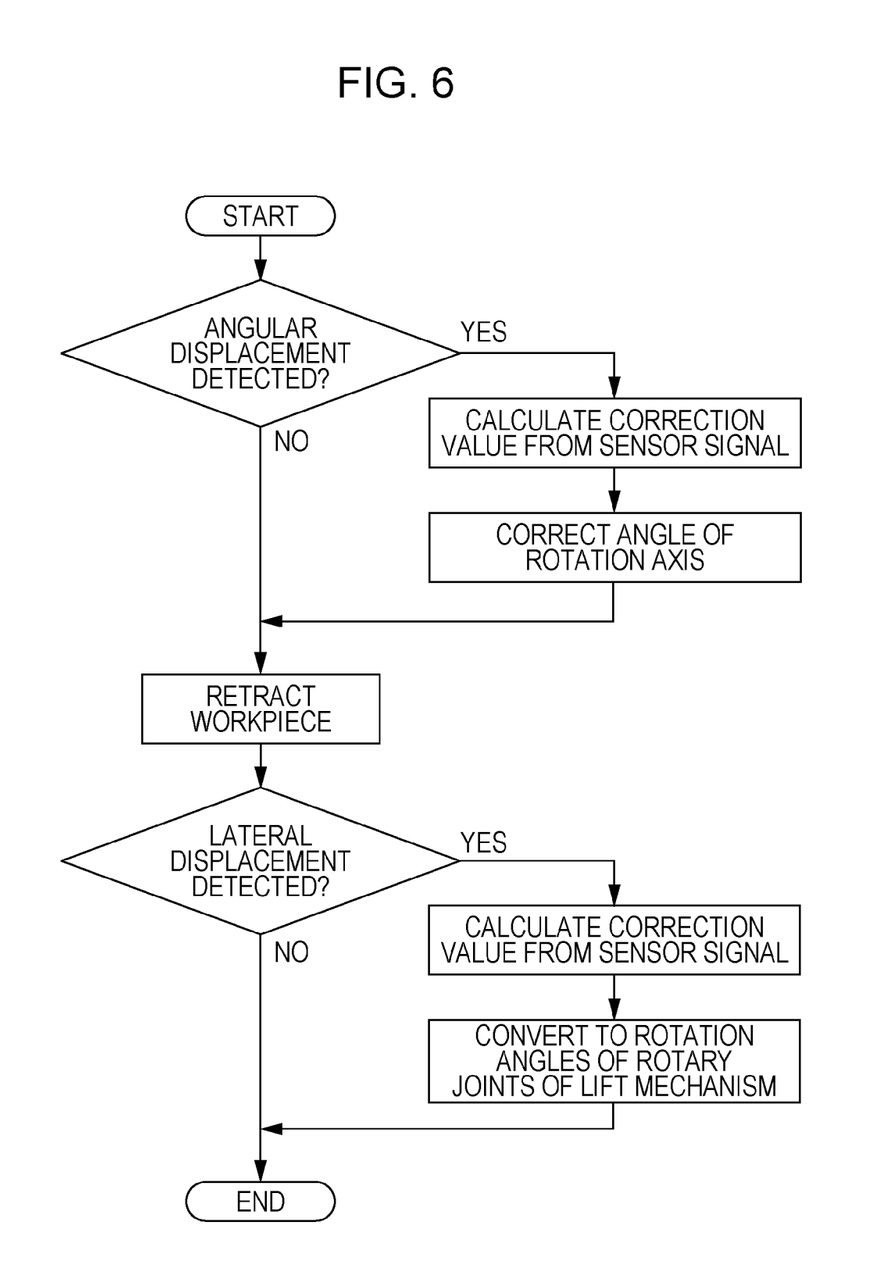
FIG. 6 is a flowchart illustrating a process of correcting displacement of a workpiece placed on a hand.

Referring to the flowchart of FIG. 6, correction of an inclination in the yaw direction and a lateral displacement will be described.

(1) A workpiece is placed on a hand of the robot.
(2) An angular displacement is detected from a relative angle of two sensors disposed on the hand.
(3) The angular displacement detected in step 2 is corrected by being converted to a rotation angle of the rotation mechanism.
(4) When the workpiece placed on the hand of the robot has been retracted, lateral displacement is detected with distance detection sensors disposed on the supporting base and the supporting member.
(5) If there is lateral displacement, the position is corrected by converting the amount of the lateral displacement to rotation angles of the joints.
(6) The robot is moved to a work area while maintaining the position in which the angle and the position have been corrected.

With these steps, displacement in the yaw direction and in the lateral direction of a workpiece placed on the hand can be corrected.

The sensors for detecting angular displacement are disposed on members of the hands 14a and 14b to which the third horizontal joints 13a and 13b are attached as illustrated in FIG. 1. Reflective proximity sensors or the like can be used as these sensors. The distance detection sensors 8a and 16a for detecting lateral displacement, which are transmission sensors, are respectively disposed on an upper surface of the supporting base 8, to which the first arm section 10a is attached, and on the lower surface of the supporting member 16, to which the first arm section 10b is attached, so as to face each other. The distance detection sensors are disposed at positions in the vicinity of the supporting column 15 through which a side of a workpiece passes.

Even if the sensors for detecting angular displacement are not provided to the hand, inclination of a workpiece in the yaw direction can be detected if the detected values of the transmission sensors vary when the hand is retracted to a space between the supporting base and the supporting member. The inclination in the yaw direction can be calculated from the difference in the detected values. The inclination that has been calculated can be corrected by converting the inclination to a rotation angle around the rotation axis.

Next, referring to FIG. 1, movement of the horizontal arm mechanism 30 will be described. First ends of the first arm sections 10a and 10b are respectively connected to the supporting base 8 and the supporting member 16. Second ends of the first arm sections 10a and 10b are respectively connected to first ends of the second arm sections 12a and 12b via the second horizontal joints 11a and 11b. Second ends of the second arm sections 12a and 12b are respectively connected to the hands 14a and 14b via the third horizontal joints 13a and 13b. When rotation drive mechanisms included in the supporting base 8 and the supporting member 16 are driven, the driving force is transmitted to the horizontal joints through, for example, a belt drive, and the hands 14a and 14b are moved in one direction. The hand 14a is illustrated to be at a position at which the arms are extended, and the hand 14b is illustrated to be at a position at which the arms are contracted. In the present embodiment, in the upper and lower parts of the horizontal arm mechanism 30, the second horizontal joints 11a and 11b are extended toward opposite directions. However, this is not a limitation, and, for example, the second horizontal joints 11a and 11b may be moved in a horizontal direction opposite the supporting column 15.

In the present invention, a multi-joint robot having upper and lower arms has been described. However, it is self-evident that the present invention can be applied to a multi-joint robot having an upper arm or a lower arm. A transfer robot having rotary joints as the first to third horizontal joints have been described. However, it is clear that a transfer robot having a third horizontal joint that is fixed has similar function and advantages.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A transfer robot comprising:
   a hand section on which an object is to be placed;
   a horizontal arm mechanism connected to the hand section and including at least two rotary joints, the horizontal arm mechanism being configured to extend and contract so as to move the hand section along one direction; and
   a lift mechanism configured to move the horizontal arm mechanism up and down and including a plurality of link mechanisms disposed on a base member, the horizontal arm mechanism being disposed between parts of the lift mechanism when the horizontal arm mechanism is moved to a lowest position, wherein at least one of the at least two rotary joints of the horizontal arm mechanism is disposed vertically between an uppermost portion of the lift mechanism and a lowermost portion of the lift mechanism when the horizontal arm mechanism is moved to the lowest position.

2. The transfer robot according to claim 1,
wherein each of the plurality of link mechanisms includes
a first leg section having a first end and a second end opposite to the first end in a longitudinal direction of the first leg section, and
a second leg section having a third end in a longitudinal direction of the second leg section,
wherein the first end of the first leg section is connected to a leg supporting member,
wherein the second end of the first leg section is connected to the third end of the second leg section, and
wherein the first leg section is longer than the leg supporting member.

3. The transfer robot according to claim 1,
wherein each of the plurality of link mechanisms includes
a first leg section having a first end and a second end opposite to the first end in a longitudinal direction of the first leg section, and
a second leg section having a third end in a longitudinal direction of the second leg section,
wherein the first end of the first leg section is connected to a leg supporting member,
wherein the second end of the first leg section is connected to the third end of the second leg section, and
wherein the first leg section is longer than the second leg section.

4. The transfer robot according to claim 1,
wherein each of the plurality of link mechanisms includes
a first leg section having a first end and a second end opposite to the first end in a longitudinal direction of the first leg section, and
a second leg section having a third end in a longitudinal direction of the second leg section,
wherein the first end of the first leg section is connected to a leg supporting member via a first joint,
wherein the second end of the first leg section is connected to the third end of the second leg section via a second joint, and
wherein at least one of the first joint and the second joint includes a drive mechanism configured to rotate the first leg section and the second leg section.

5. The transfer robot according to claim 1, further comprising:
a rotation mechanism configured to rotate the lift mechanism,
wherein the lift mechanism includes the plurality of link mechanisms that are plane-symmetrically disposed about a rotation axis of the rotation mechanism with respect to the one direction in which the hand section is moved.

6. The transfer robot according to claim 1, further comprising:
a rotation mechanism configured to rotate the lift mechanism,
wherein the rotation mechanism is disposed substantially at a center of the base member.

7. The transfer robot according to claim 1, wherein the horizontal arm mechanism and the hand section are disposed sandwiched between parts of the lift mechanism along a horizontal plane when the horizontal arm mechanism is moved to the lowest position.

8. The transfer robot according to claim 1,
wherein the lift mechanism includes leg supporting members that extend upwardly,
wherein the plurality of link mechanisms are connected to upper ends of the leg supporting members, and
wherein the upper ends of the leg supporting members are the uppermost portion of the lift mechanism when the horizontal arm mechanism is moved to the lowest position.

9. The transfer robot according to claim 8, wherein the horizontal arm mechanism and the hand section are disposed sandwiched between the leg supporting members along a horizontal plane when the horizontal arm mechanism is moved to the lowest position.

10. The transfer robot according to claim 8,
wherein each of the plurality of link mechanisms includes
a first leg section having a first end and a second end opposite to the first end in a longitudinal direction of the first leg section, the first end being pivotally connected to a respective upper end of a respective leg supporting member, and
a second leg section having a third end and a fourth end opposite to the third end in a longitudinal direction of the second leg section,
wherein the second end of the first leg section is pivotally connected to the third end of the second leg section, and
wherein the fourth end of the second leg section is pivotally connected to the horizontal arm mechanism.

11. A transfer robot comprising:
a hand section on which an object is to be placed;
a horizontal arm mechanism connected to the hand section and including at least two rotary joints, the horizontal arm mechanism being configured to extend and contract so as to move the hand section along one direction; and
a link mechanism configured to move the horizontal arm mechanism up and down,
wherein the horizontal arm mechanism includes:
a supporting base connected to the link mechanism and provided beneath the hand section; and
a supporting member directly connected to one of the at least two rotary joints and provided above the hand section, and
wherein the horizontal arm mechanism is configured so that the hand section is disposed between the supporting base and the supporting member when the object has been taken out.

12. The transfer robot according to claim 11,
wherein the at least two rotary joints include
a first horizontal joint disposed on the supporting base, and
a second horizontal joint disposed on the supporting member, and
wherein the first horizontal joint and the second horizontal joint are disposed coaxial with each other.

13. The transfer robot according to claim 11,
wherein the at least two rotary joints include
a first horizontal joint disposed on the supporting base, and
a second horizontal joint disposed on the supporting member, and
wherein the first horizontal joint and the second horizontal joint are disposed coaxial with each other and in an offset manner with respect to the one direction in which the hand section is moved.

14. The transfer robot according to claim 11, further comprising:
a rotation mechanism configured to rotate the link mechanism and disposed on a base member,
wherein the at least two rotary joints include
a first horizontal joint disposed on the supporting base, and
a second horizontal joint disposed on the supporting member, and
wherein the first horizontal joint and the second horizontal joint are disposed coaxial with each other and offset from the rotation mechanism with respect to the one direction in which the hand section is moved.

15. The transfer robot according to claim 11,
wherein the horizontal arm mechanism includes arms that are symmetrically disposed in an upper part and a lower part of the horizontal arm mechanism.

16. The transfer robot according to claim 11, wherein the horizontal arm mechanism is configured so that the hand section is disposed sandwiched between a supporting base and a supporting member along a vertical plane when the object has been taken out.

17. A transfer robot comprising:
a hand section on which an object is to be placed;
a horizontal arm mechanism connected to the hand section and including at least two rotary joints, the horizontal arm mechanism being configured to extend and contract so as to move the hand section along one direction; and
a lift mechanism including a plurality of link mechanisms configured to move the horizontal arm mechanism up and down and disposed on a base member,
wherein the horizontal arm mechanism is configured to move in one of a roll direction or a lateral direction with respect to the one direction in which the hand section is moved by rotatably positioning at least two rotary joints of the plurality of link mechanisms at a predetermined angle, and
wherein the plurality of link mechanisms of the lift mechanism is connected to a supporting base of the horizontal arm mechanism to form a closed loop linkage.

18. The transfer robot according to claim 17,
wherein a first link mechanism among the plurality of link mechanisms includes a first rotary joint,
wherein a second link mechanism among the plurality of link mechanisms includes a second rotary joint disposed in a symmetric position of the first rotary joint, and
wherein, when the horizontal arm mechanism moves in the roll direction, if the first rotary joint rotates clockwise by a predetermined angle, the second rotary joint rotates counterclockwise by the predetermined angle.

19. The transfer robot according to claim 17,
wherein a first link mechanism among the plurality of link mechanisms includes a first rotary joint,
wherein a second link mechanism among the plurality of link mechanisms includes a second rotary joint disposed in a symmetric position of the first rotary joint, and
wherein, when the horizontal arm mechanism moves in the lateral direction, if the first rotary joint rotates clockwise by a predetermined angle, the second rotary joint rotates clockwise by the predetermined angle.

20. The transfer robot according to claim 17, further comprising:
sensors configured to detect a position of the object and disposed on the supporting base, a supporting member, and the hand section, the supporting member being provided in the horizontal arm mechanism.

21. The transfer robot according to claim 17, further comprising:
sensors configured to detect a position of the object and disposed on the supporting base and a supporting member so that a side of the object passes between the sensors, the supporting member being provided in the horizontal arm mechanism.

22. The transfer robot according to claim 17, further comprising:
sensors configured to detect a position of the object,
wherein the horizontal arm mechanism has a symmetric structure with respect to a direction in which the object is transferred, and
wherein the sensors are disposed on the supporting base and a supporting member so as to have a symmetric structure, the supporting member being provided in the horizontal arm mechanism.

23. The transfer robot according to claim 17, further comprising:
sensors configured to detect a position of the object,
wherein the sensors comprise transmissive photosensors,
wherein the horizontal arm mechanism includes a supporting base, a supporting column, and a supporting member having a U-shape, and
wherein the sensors are disposed on an upper surface of the supporting base and a lower surface of the supporting member, the upper and lower surfaces facing each other.

24. The transfer robot according to claim 23,
wherein the transmissive photosensors detect an amount of light shielded by the object when a side of the object passes between the sensors as an amount of lateral displacement of the object.

* * * * *